(12) United States Patent
Yeh et al.

(10) Patent No.: US 8,536,646 B2
(45) Date of Patent: Sep. 17, 2013

(54) TRENCH TYPE POWER TRANSISTOR DEVICE

(75) Inventors: Teng-Hao Yeh, Hsinchu (TW); Shian-Hau Liao, Taichung (TW); Chia-Hui Chen, Taichung (TW); Sung-Shan Tai, San Jose, CA (US)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 7 days.

(21) Appl. No.: 13/237,940

(22) Filed: Sep. 21, 2011

(65) Prior Publication Data

US 2013/0069143 A1    Mar. 21, 2013

(51) Int. Cl.
*H01L 29/66*    (2006.01)

(52) U.S. Cl.
USPC ............................ 257/330; 257/331; 257/334

(58) Field of Classification Search
None
See application file for complete search history.

(56) References Cited

U.S. PATENT DOCUMENTS

| 6,838,722 B2 | 1/2005 | Bhalla | |
|---|---|---|---|
| 7,772,642 B2 | 8/2010 | Marchant | |
| 7,868,381 B1* | 1/2011 | Bhalla et al. | 257/330 |
| 8,089,122 B2* | 1/2012 | Mizokuchi et al. | 257/328 |
| 2007/0111446 A1 | 5/2007 | Spring | |
| 2008/0179662 A1* | 7/2008 | Hshieh | 257/328 |
| 2008/0315301 A1* | 12/2008 | Takemori et al. | 257/331 |
| 2010/0078717 A1* | 4/2010 | Venkatraman | 257/330 |
| 2012/0292694 A1* | 11/2012 | Hsieh | 257/331 |

* cited by examiner

*Primary Examiner* — Matthew Landau
*Assistant Examiner* — Priya Rampersaud
(74) *Attorney, Agent, or Firm* — Winston Hsu; Scott Margo

(57) ABSTRACT

The present invention provides a trench type power transistor device including a semiconductor substrate, at least one transistor cell, a gate metal layer, a source metal layer, and a second gate conductive layer. The semiconductor substrate has at least one trench. The transistor cell includes a first gate conductive layer disposed in the trench. The gate metal layer and the source metal layer are disposed on the semiconductor substrate. The second gate conductive layer is disposed between the first gate conductive layer and the source metal layer. The second gate conductive layer electrically connects the first gate conductive layer to the gate metal layer, and the second gate conductive layer is electrically insulated from the source metal layer and the semiconductor substrate.

12 Claims, 10 Drawing Sheets

TRENCH TYPE POWER TRANSISTOR DEVICE

BACKGROUND OF THE INVENTION

1. Field of the Invention

The present invention relates to a trench type power transistor device and a method of fabricating the same, and more particularly, to a trench type power transistor device having a low input resistance of a gate and a method of fabricating the same.

2. Description of the Prior Art

Power transistor devices are mainly applied to power management devices, such as switching power supplies, power management integrated circuits for computers or computer accessories, backlight power supplies and motor control devices, etc., and can be sorted as metal-oxide-semiconductor thin film transistor (MOSFET) devices and insulated gate bipolar transistor (IGBT) devices, etc. In general, the power transistor devices are designed with trenches to lower power consumptions.

In the trench type power transistor device, a gate conductive layer is disposed in a plurality of trenches of a substrate, and a doped body region is disposed in the substrate at sides of the trenches. Furthermore, a source region is disposed in the doped body region, so that a channel is vertically formed between the source region and the substrate. As we can see that a channel width of the trench type power transistor device is depended on the number of the trenches, and an on-resistance (Ron) of the trench type transistor power transistor device is depended on the channel width. Thus, the number of the trenches can be increased to augment the on-resistance. In addition, a source metal layer used for electrically connecting the source region to the outside is disposed in an active region, and a gate metal layer used for electrically connecting the gate conductive layer to the outside is disposed in a peripheral region surrounding the active region. Generally, the gate conductive layer is electrically connected to the gate metal layer by extending the trenches to the peripheral region, and the gate metal layer can be directly disposed on the gate conductive layer.

However, a size of the trench type power transistor device is generally fixed, so that a width of each trench is reduced when the number of the trenches is increased. However, since the widths of the trenches are reduced, a quantity of the gate conductive layer filling into the trenches is reduced, and a resistance between the gate conductive layer at the middle of each trench and the gate metal layer is increased. The input resistance of the gate of the trench type power transistor device is accordingly raised, and a delay time of resistive-capacitive delay is also increased.

As a result, to reduce an input resistance of the gate of the trench type power transistor device when the widths of the trenches are reduced is an important objective in this industry.

SUMMARY OF THE INVENTION

It is therefore a primary objective of the present invention to provide a trench type power transistor device and a method of fabricating the same to reduce an input resistance of the gate.

According to a preferred embodiment of the present invention, a trench type power transistor device is provided. The trench type power transistor device includes a semiconductor substrate of a first conductivity type, at least one transistor cell, a gate metal layer, a source metal layer, and a second gate conductive layer. The semiconductor substrate has an active region and a peripheral region, and the semiconductor substrate has at least one first trench. The transistor cell is disposed in the active region, and the transistor cell includes a first gate conductive layer, a gate insulating layer, a doped body region of a second conductivity type, and a doped source region of the first conductivity type. The first gate conductive layer is disposed in the first trench. The gate insulating layer is disposed in the first trench and between the first gate conductive layer and the semiconductor substrate. The doped body region is disposed in the semiconductor substrate at a side of the first trench, and the doped source region is disposed in the doped body region. The gate metal layer is disposed on the semiconductor substrate in the peripheral region, and the source metal layer is disposed on the semiconductor substrate in the active region. The second gate conductive layer is disposed between the first gate conductive layer and the source metal layer, wherein the second gate conductive layer electrically connects the first gate conductive layer to the gate metal layer, and the second gate conductive layer is electrically insulated from the source metal layer and the semiconductor substrate.

According to a preferred embodiment of the present invention, a method of fabricating a trench type power transistor device is provided. First, a semiconductor substrate of a first conductivity type is provided, wherein the semiconductor substrate has an active region and a peripheral region. Then, at least one trench is formed on the semiconductor substrate. Next, at least one transistor cell is formed in the active region, wherein the transistor cell includes a first gate conducive layer, a gate insulating layer, a doped body region of a second conductivity type, and a doped source region of the first conductivity type. The first gate conductive layer is disposed in the trench, and the gate insulating layer is disposed in the trench and between the first gate conductive layer and the semiconductor substrate. The doped body region is disposed in the semiconductor substrate at a side of the trench. The doped source region is disposed in the doped body region. Subsequently, at least one gate lead is formed on the first gate conductive layer, wherein the gate lead is electrically insulated from the semiconductor substrate. Thereafter, a source metal layer is formed on the gate lead in the active region and a gate metal layer is formed on the gate lead in the peripheral region, wherein the gate lead electrically connects the first gate conductive layer to the gate metal layer, and the gate lead is electrically insulated from the source metal layer.

The present invention disposes the second conductive layer between the source metal layer and the first gate conductive layer to electrically connect the first gate conductive to the gate metal layer for shorten the distance between the first gate conductive layer away from the third trench and the gate metal layer. Accordingly, the resistance of each gate of each transistor cell can be reduced, and the input resistance of the gate of the trench type power transistor device can be also reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
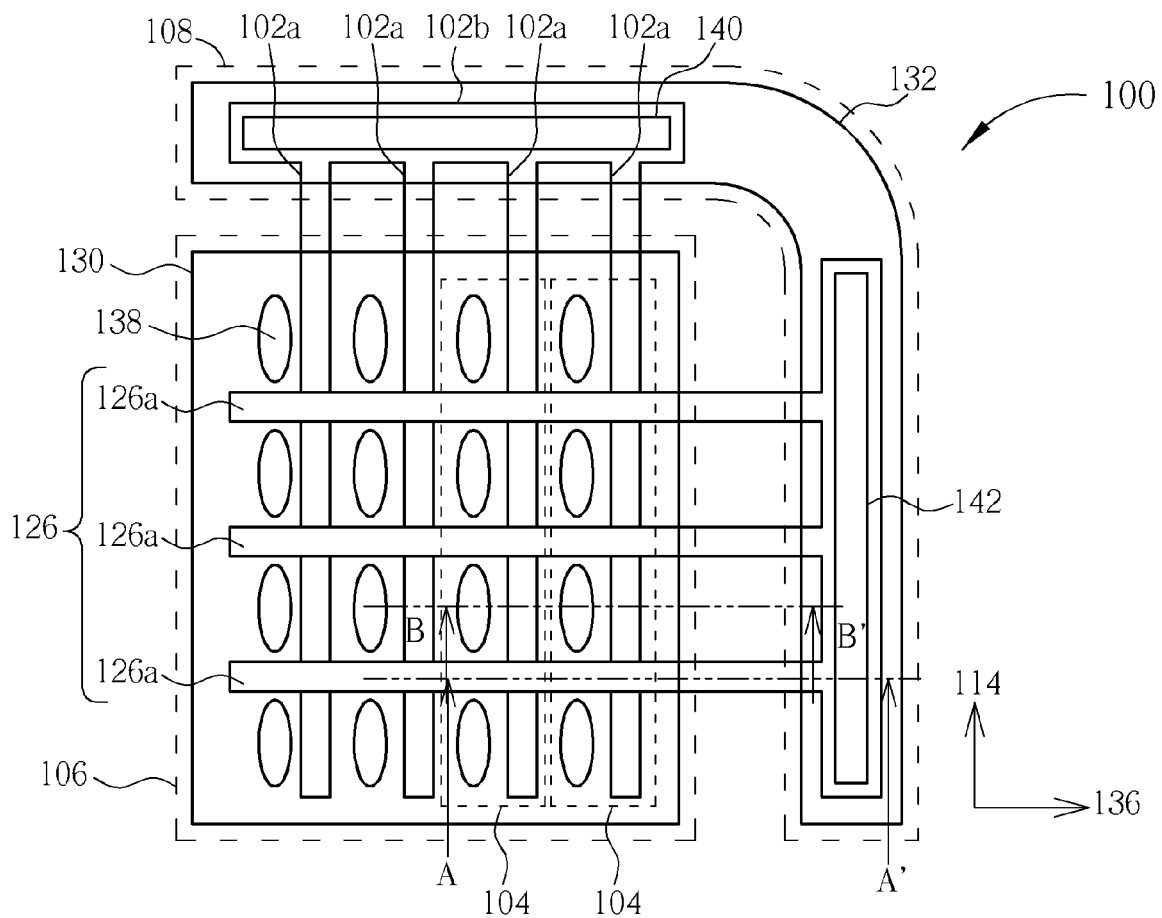
FIG. 1 is a schematic diagram illustrating a top view of a trench type power transistor device according to a first preferred embodiment of the present invention.
Figure 2:
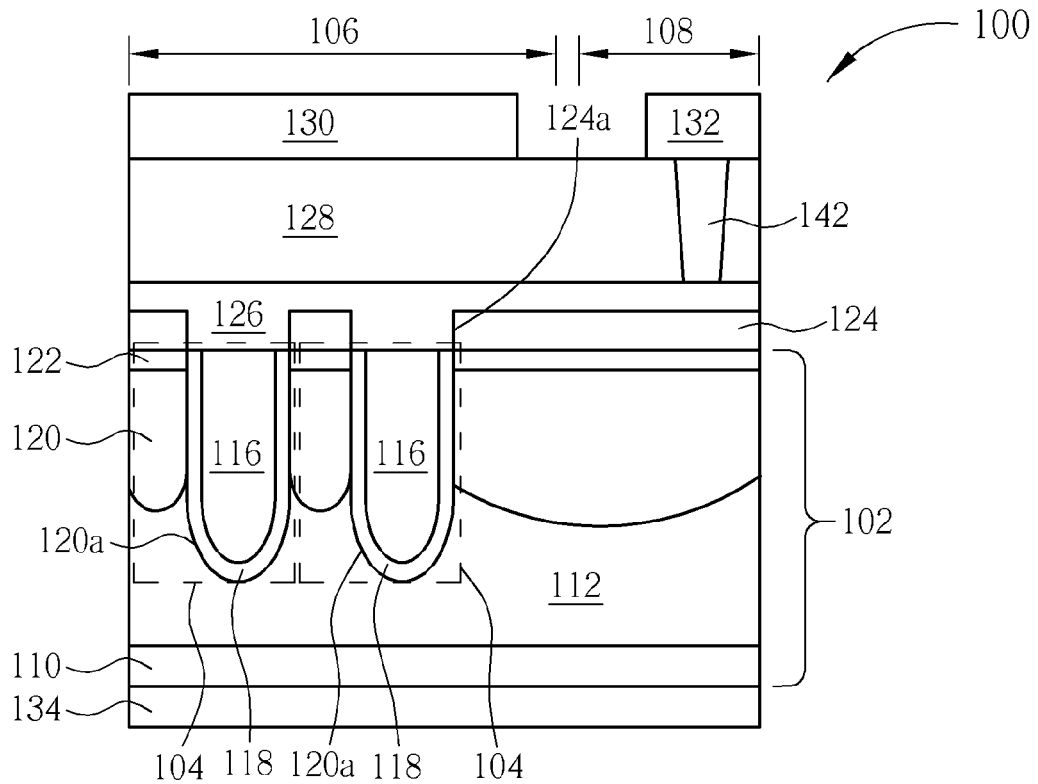
FIG. 2 and FIG. 3 are schematic diagrams respectively illustrating cross-sectional views of FIG. 1 taken along a line A-A' and along a line B-B'.
Figure 3:
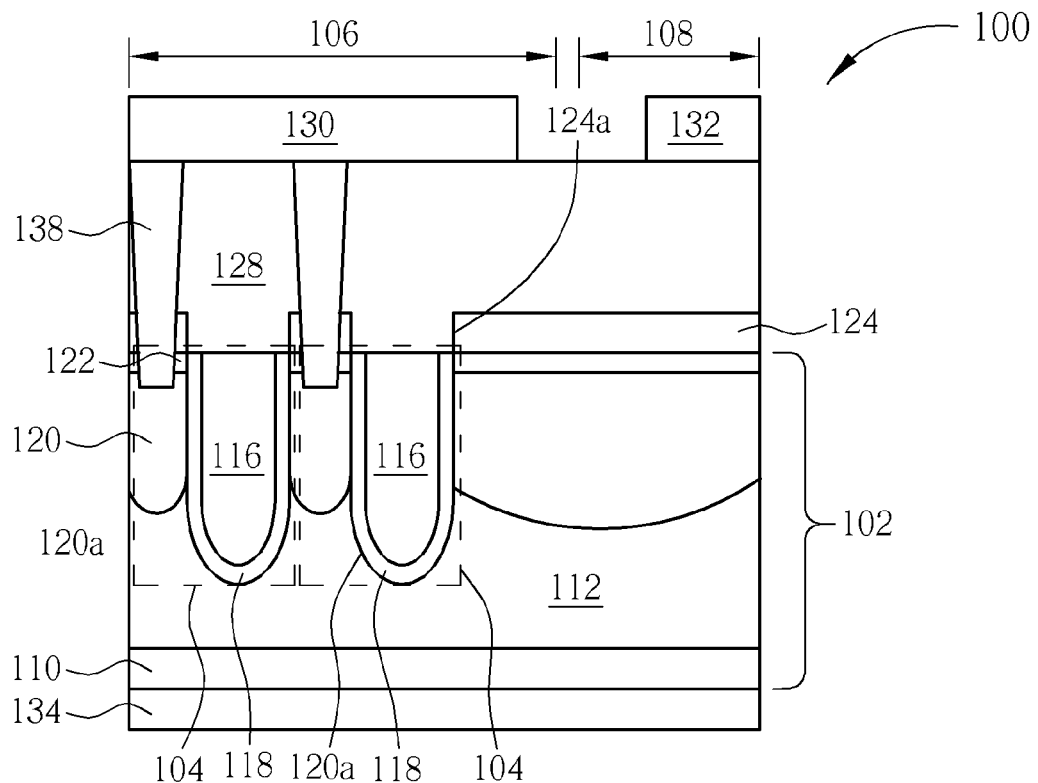

Referring to FIG. 1 through FIG. 3, FIG. 1 is a schematic diagram illustrating a top view of a trench type power transistor device according to a first preferred embodiment of the present invention, and FIG. 2 and FIG. 3 are schematic diagrams respectively illustrating cross-sectional views of FIG. 1 taken along a line A-A' and along a line B-B'. As shown in FIG. 1 through FIG. 3, the trench type power transistor device 100 includes a semiconductor substrate 102 of a first conductivity type, and a plurality of transistor cells 104. The semiconductor substrate 102 has an active region 106 used to fabricating the transistor cells 104 and a peripheral region 108 used to fabricating a termination structure for tolerating high voltage from the transistor cells 104, and the peripheral region 108 surrounds the active region 106. In this embodiment, the first conductivity type is N-type, but the present invention is not limited to this. Also, the N-type semiconductor substrate 102 can include an N-type substrate 110, such as a silicon wafer, and an N-type epitaxial layer 112 disposed on the N-type substrate 110, but the present invention is not limited herein. Furthermore, a top surface of the N-type semiconductor substrate 102 has a plurality of first trenches 102a and a third trench 102b. The first trenches 102a are stripe-shaped. Each stripe-shaped first trench 102a is disposed along a first direction 114, so that the first trenches 102a are parallel to each other. The third trench 102b is disposed in the peripheral region 108, and each stripe-shaped first trench 102a extends across the active region 106 and into the peripheral region 108 to connect the third trench 102b. The number of the first trenches 102a of the present invention is not limited to the above-mentioned, and can be only one.

Furthermore, the transistor cells 104 are disposed in the active region 106, and each transistor cell 104 includes a first gate conductive layer 116, a gate insulating layer 118, a doped body region 120 of a second conductivity type, and an N-type doped source region 122. In this embodiment, the second conductivity type is P-type. The present invention is not limited herein, and the first conductivity type and the second conductivity type also can respectively be P-type and N-type. The gate insulating layer 118 is disposed in each first trench 102a and covers a surface of each first trench 102a. The first gate conductive layer 116 serves as a gate of each transistor cell 104 and is disposed in each first trench 102a and the third trench 102b, and each first trench 102a and the third trench 102b are filled with the first gate conductive layer 116, so that the gate of each transistor cell 104 can be electrically connected to the peripheral region 108 by the first gate conductive layer 116 extending from the first trenches 102a to the third trench 102b. In each first trench 102a, the gate insulating layer 118 is disposed between the first gate conductive layer 116 and the N-type semiconductor substrate 102. Each P-type doped body region 120 is disposed in the N-type semiconductor substrate 102 at a side of each first trench 102a, and each N-type doped source region 122 serving as a source of each transistor cell 104 is disposed in each P-type doped body region 120 adjacent to each first trench 102a. The N-type semiconductor substrate 102 serves as a drain of each transistor cell 104, so that each P-type doped body region 120 between each N-type doped source region 122 and the N-type semiconductor substrate 102 and close to each first trench 102a serves as a channel of each transistor cell 104. The number of the transistor cell 104 in the present invention is not limited to the above-mentioned, and the number of the transistor cell 104 is depended on the number of the first trench 102a, so that the number of the transistor cell 104 also can be only one.

In addition, the trench type power transistor device 100 further includes a first insulating layer 124, a second gate conductive layer 126, a second insulating layer 128, a source metal layer 130, a gate metal layer 132, and a drain metal layer 134. The first insulating layer 124 is disposed on the N-type semiconductor substrate 102, and the first insulating layer 124 has a plurality of openings 124a, each of which respectively exposing each first trench 102a. The number of the opening 124a in the present invention is not limited to be a plurality, and the number of the opening 124a is also depended on the number of the first trench 102a, so that the number of the opening 124a also can be only one. The second gate conductive layer 126 is disposed on the first insulating layer 124, and the second gate conductive layer 126 is filled into the openings 124a to be in contact with each first gate conductive layer 116 in each first trench 102a. Accordingly, the second gate conductive layer 126 is electrically connected to the first gate conductive layer 116, and the second gate conductive layer 126 is electrically insulated from the N-type semiconductor substrate 102 by the first insulating layer 124. In this embodiment, the second gate conductive layer 126 includes a plurality of gate leads 126a, and each of which is stripe-shaped and disposed along a second direction 136 different from the first direction 114. The second direction 136 is preferably perpendicular to the first direction 114, but the present invention is not limited to this. Furthermore, each gate lead 126a stretches over the first trenches 102a and extends from the active region 106 into the peripheral region 108. The second insulating layer 128 is disposed on the second gate conductive layer 126 and between any two adjacent gate leads 126a, and the second insulating layer 128 is further filled into the openings 124a between any two adjacent gate leads 126a. In addition, the source metal layer 130 is disposed on the second insulating layer 128 in the active region 106, and the second insulating layer 128 is disposed between the second gate conductive layer 126 and the source metal layer 130 to insulate the second gate conductive layer 126 from the source metal layer 130. The gate metal layer 132 is disposed on the second insulating layer 128 and directly disposed on the third trench 102b in the peripheral region 108 so as to electrically connects the first gate conductive layer 116 in the third trench 102b, and is further extended to be directly disposed on the second gate conductive layer 126 in the peripheral region so as to electrically connects the gate leads 126a. The drain metal layer 134 is disposed under the N-type semiconductor substrate 102 and in contact with the N-type semiconductor substrate 102, so that the N-type semiconductor substrate 102 as the drain of the transistor cells 104 can be electrically connected to the outside.

It should be noted that the first gate conductive layer 116 away from the third trench 102b can be electrically connected to the gate metal layer 132 through each gate lead 126a that is disposed along the second direction 136 different from the first direction 114, so that a distance between the first gate conductive layer 116 away from the third trench 102b and the gate metal layer 132 can be shortened. Accordingly, the resistance of each gate of each transistor cell 104 can be reduced, and an input resistance of the gate of the trench type power transistor device 100 can be also reduced. In this embodiment, each first contact plug is disposed between two adjacent gate leads, so the width of each first contact plug along the first direction is limited by a gap between two adjacent gate leads, and the width of each first contact plug along the first direction can be adjusted according to the gap between two adjacent gate leads.

The trench type power transistor device 100 further includes a plurality of first contact plugs 138, at least one second contact plug 140, and at least one third contact plug 142. Each first contact plug 138 is disposed between two adjacent first trenches 102a and at a side of each gate lead 126a in the active region 108, and penetrates through the second insulating layer 128 and the first insulating layer 124 to electrically connect the source metal layer 130 and each N-type doped source region 122. It should be noted that the first contact plugs 138 between two adjacent first trenches 102a are separated by the gate leads 126a, and each gate lead 126a have at least two first contact plugs 138 respectively disposed at two sides thereof. In addition, the second contact plug 140 penetrates through the second insulating layer 128 and the first insulating layer 124 to electrically connect the gate metal layer 132 and the first gate conductive layer 116 in the third trench 102b. The third contact plug 142 penetrates through the second insulating layer 128 to electrically connect the gate metal layer 132 and the second gate conductive layer 126 in the peripheral region 108. In other embodiments of the present invention, each transistor cell 104 can further include a P-type doped contact region disposed in the P-type doped body region and in contact with the N-type doped source region and the first contact plug for reduce the resistance between the first contact plug and the N-type doped source region.

The trench type power transistor device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 4:
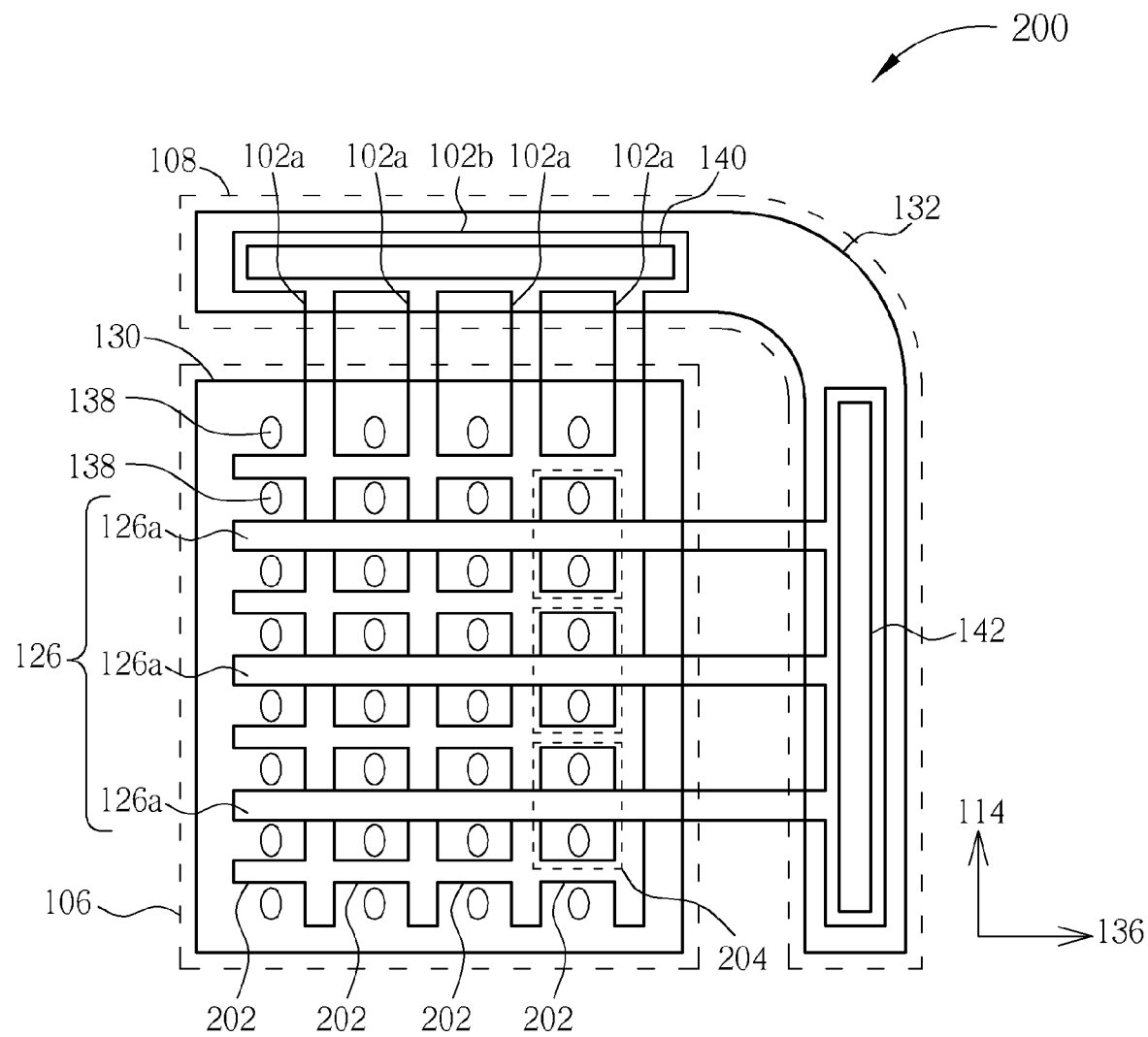
FIG. 4 is a schematic diagram illustrating a top view of a trench type power transistor device according to a modification of the first preferred embodiment of the present invention.

The shape of each first trench in the present invention is not limited to be striped-shaped, and the first trenches also can be other shapes. Referring to FIG. 4, FIG. 4 is a schematic diagram illustrating a top view of a trench type power transistor device according to a modification of the first preferred embodiment of the present invention. As shown in FIG. 4, as compared with the above-mentioned embodiment, the N-type semiconductor substrate 102 of the trench type power transistor device 200 in this modification further has a plurality of second trenches 202 in the active region 106, and each second trench 202 connects two adjacent first trenches 102a. Each P-type doped body region 120 is disposed in a region surrounded by two adjacent first trenches 102a and two adjacent second trenches 202 disposed between the two adjacent first trenches 102a, and each N-type doped source region 122 is disposed in each P-type doped body region 120 in the region, so that two adjacent first trenches 102a and two adjacent second trenches 202 disposed between the two adjacent first trenches 102a define one transistor cell 204. In this embodiment, the second trenches 202 disposed between any two of the adjacent first trenches 102a are arranged in the first direction 114 and parallel to each other, so that each transistor cell 204 is rectangular. Furthermore, the second trenches 202 form a plurality of stripe-shaped trenches, so that the transistor cells 204 can be arranged in a matrix formation. The second trenches 202 of the present invention are not limited to form a plurality of stripe-shaped trenches, and can be disconnected to each other.

Figure 5:
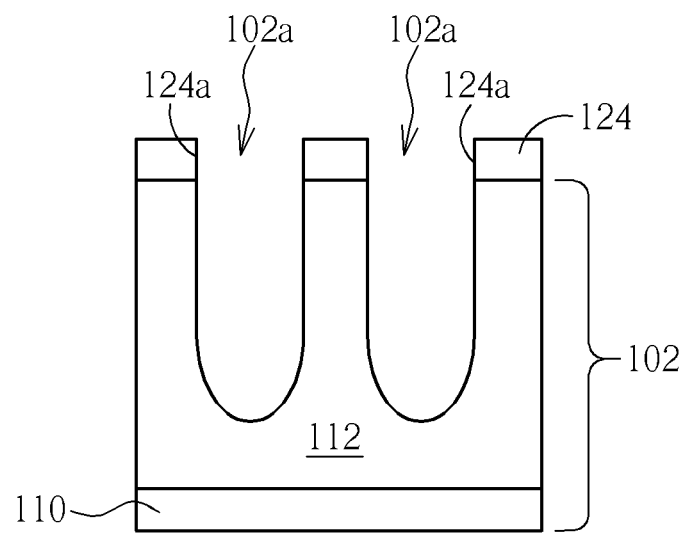
FIG. 5 through FIG. 11 are schematic diagrams illustrating a method of fabricating the trench type power transistor device according to the first preferred embodiment of the present invention.
Figure 10:
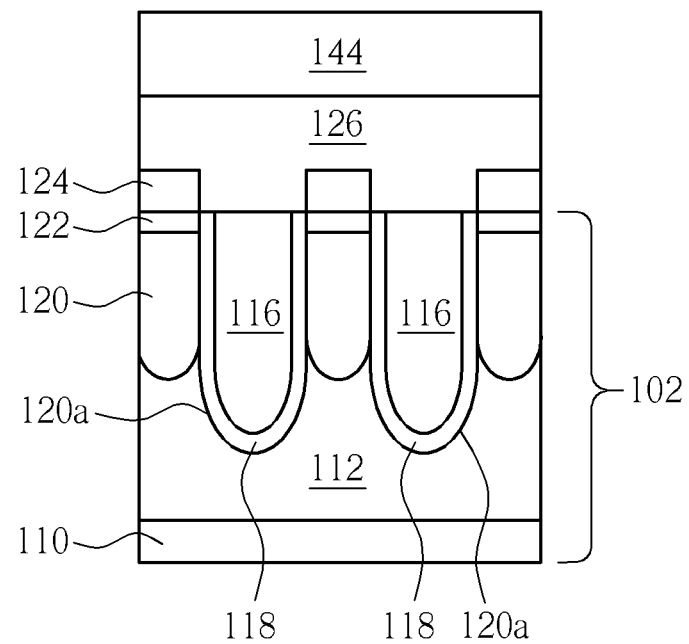
Figure 11:
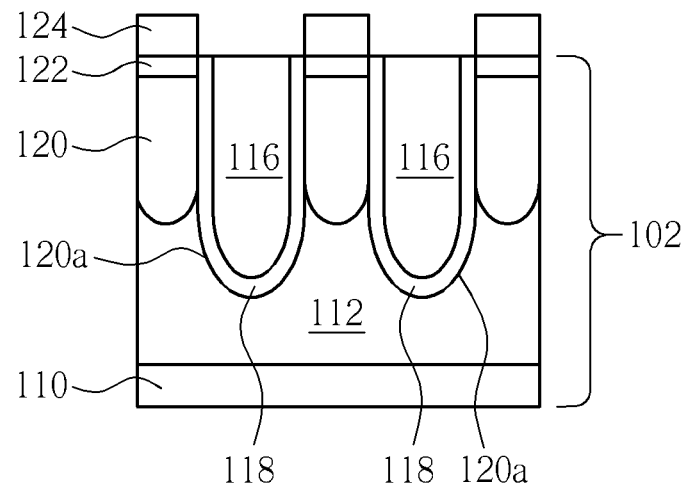

Furthermore, the present invention further provides a method of fabricating the trench type power transistor device. Referring to FIG. 5 through FIG. 11 and referring to FIG. 2 and FIG. 3 again, FIG. 5 through FIG. 11 are schematic diagrams illustrating a method of fabricating the trench type power transistor device according to the first preferred embodiment of the present invention, wherein FIG. 10 is a cross-sectional view illustrating a step of the method of fabricating the trench type power transistor device shown in FIG. 1 taken along the line A-A', and FIG. 11 is a cross-sectional view illustrating the step of the method of fabricating the trench type power transistor device shown in FIG. 1 taken along the line B-B'. As shown in FIG. 5, the N-type semiconductor substrate 102 is provided, and then the first insulating layer 124, such as oxide or silicon nitride, is formed on the N-type semiconductor substrate 102. Next, the first insulating layer 124 is patterned to have the openings 124a exposing the N-type semiconductor substrate 102. Subsequently, the first insulating layer 124 is used as a mask, and an etching process is performed to remove the exposed N-type semiconductor substrate 102 so as to form the first trenches 102a and the third trench 102b.

Figure 6:
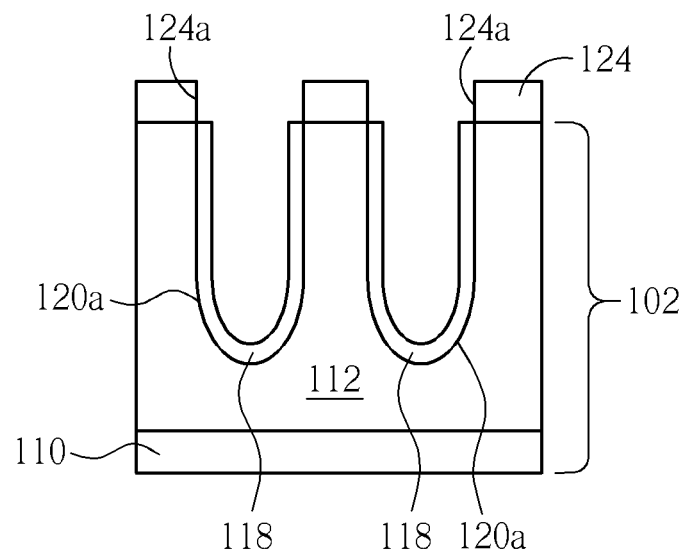

As shown in FIG. 6, afterward, a thermal oxidation process is performed to form the gate insulating layer 118, such as oxide, on the N-type semiconductor substrate 102 in the first trenches 102a. The gate insulating layer 118 in the present invention is not limited to be formed by the thermal oxidation process, and also can be formed by other process, such as a deposition process combined with an etching back process.

Figure 7:
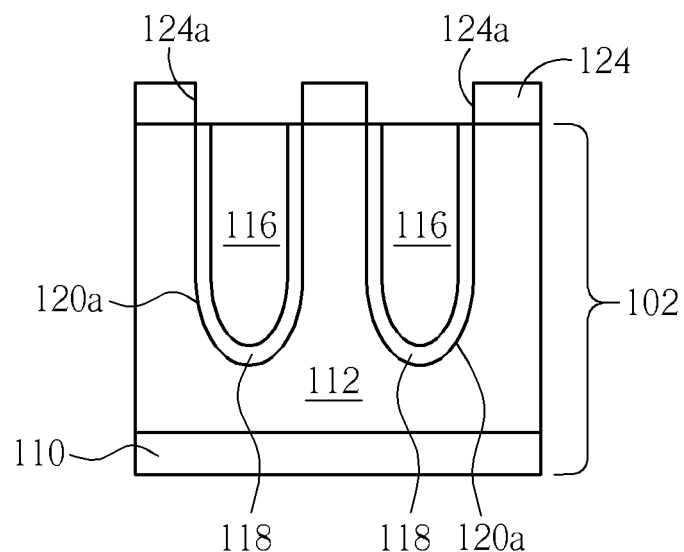

As shown in FIG. 7, then, a deposition process is performed to form the first gate conductive layer 116, such as polysilicon, covering the N-type semiconductor substrate 102, and the first trenches 102a and the third trench 102b is filled up with the first gate conductive layer 116. Subsequently, an etching back process is performed to remove the first gate conductive layer 116 until a top surface of the first gate conductive layer 116 is located at the same level as or located under the top surface of the N-type semiconductor substrate 102. That is, when the first gate conductive layer 116 outside the first trenches 102a and the third trench 102b is removed, the etching back process is stopped.

Figure 8:
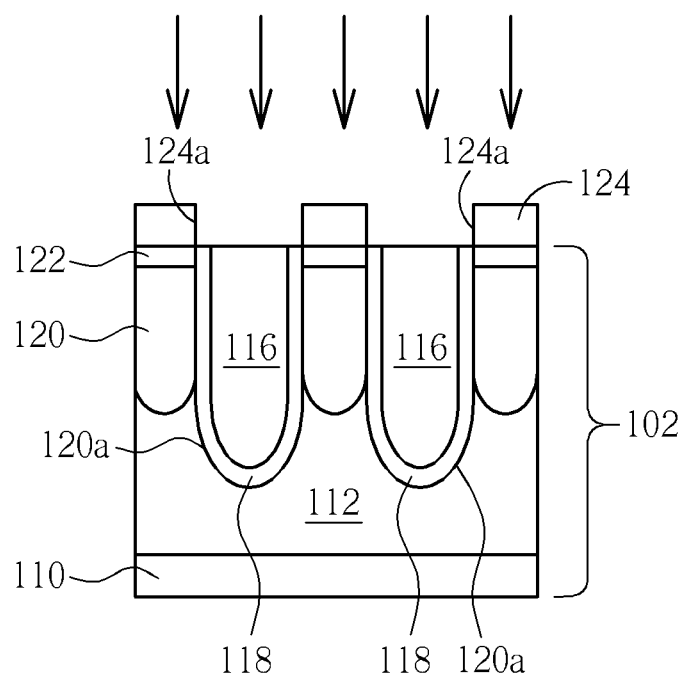

As shown in FIG. 8, next, a P-type ion implantation process is performed to implant P-type ions, such as boron ions, in the N-type semiconductor substrate 102 at two sides of each first trench 102a, and a thermal drive-in process is performed to diffuse the P-type ions to form the P-type doped body regions 120. Thereafter, an N-type ion implantation process is performed to implant N-type ions, such as arsenic ions or phosphorus ions, in the P-type doped body regions 120, and another thermal drive-in process is performed to diffuse the N-type ions to form the N-type doped source regions 122.

Figure 9:
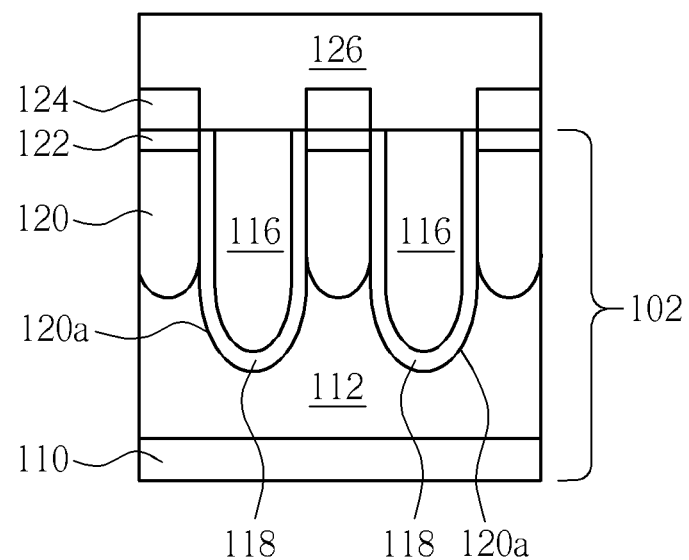

As shown in FIG. 9, a deposition process is performed to form the second gate conductive layer 126, such as polysilicon or silicide, on the first insulating layer 124 and the first gate conductive layer 116, and the second gate conductive layer 126 is filled into the openings 124a.

As shown in FIG. 10 and FIG. 11, a patterned photoresist layer 144 is then formed on the second gate conductive layer 126 to define the position of the gate leads 126a, and the second gate conductive layer 126 is patterned to form the gate leads 126a and expose the first insulating layer 124 and the first gate conductive layer 116.

As shown in FIG. 2 and FIG. 3, the patterned photoresist layer 144 is removed next, and the second insulating layer 128 is formed on the second gate conductive layer 126, the exposed first insulating layer 124 and the exposed first gate conductive layer 116. Then, a photolithographic and etching process is performed to form a plurality of first contact holes in the active region 106 and a second contact hole on the third trench 102b. Each first contact hole penetrates through the second insulating layer 128, the first insulating layer 124 and the N-type doped source region 122 and exposes the P-type doped body region 120, and the second contact hole penetrates through the second insulating layer 128 and the first insulating layer 124 and exposes the first gate conductive layer 116. The first contact plugs 138 is then formed in the first contact holes to be in contact with the N-type source region 122, and simultaneously, the second contact plug 140 is formed in the second contact hole to be in contact with the first gate conductive layer 116. Furthermore, a third contact hole penetrating through the second insulating layer 128 is then formed to expose the second gate conductive layer 126 in the peripheral region 108, and the third contact plug 142 is formed in the third contact hole to be in contact with the second gate conductive layer 126. Since the first contact plugs 138, the second contact plug 140, and the third contact plug 142 are located at different position, the steps of forming the first contact plugs 138, the second contact plug 140 and the third contact plug 142 can be exchanged and adjusted according to the requirements, and the present invention is not limited herein. A metal layer is subsequently formed on the second insulating layer 128, and a photolithographic and etching process is performed to pattern the metal layer to form the source metal layer 130 and the gate metal layer 132. The source metal layer 130 is in contact with the first contact plugs 138, and the gate metal layer 132 is in contact with the second contact plug 140 and the third contact plug 142. Furthermore, the drain metal layer 134 is formed under the N-type semiconductor substrate 102, and the trench type power transistor device 100 of this embodiment is finished. In other embodiments of the present invention, the second trenches 202 can be formed in the same step of forming the first trenches 102a.

The method of fabricating the trench type power transistor device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 12:
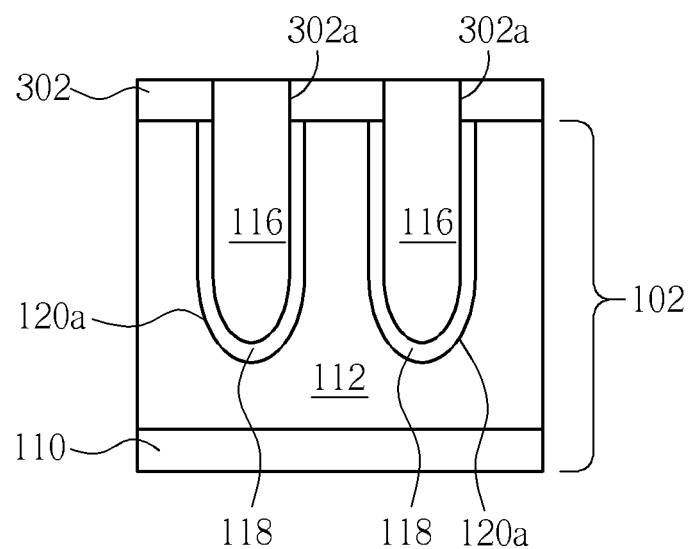
FIG. 12 through FIG. 18 are schematic diagrams illustrating a method of fabricating a trench type power transistor device according to a second preferred embodiment of the present invention.
Figure 15:
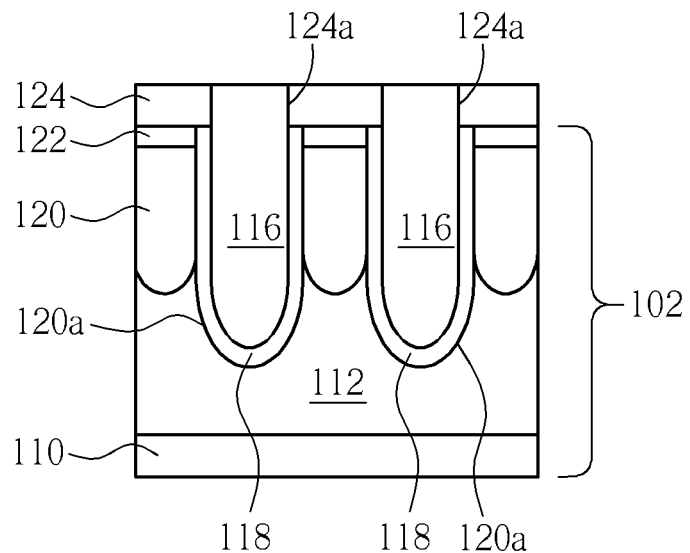
Figure 16:
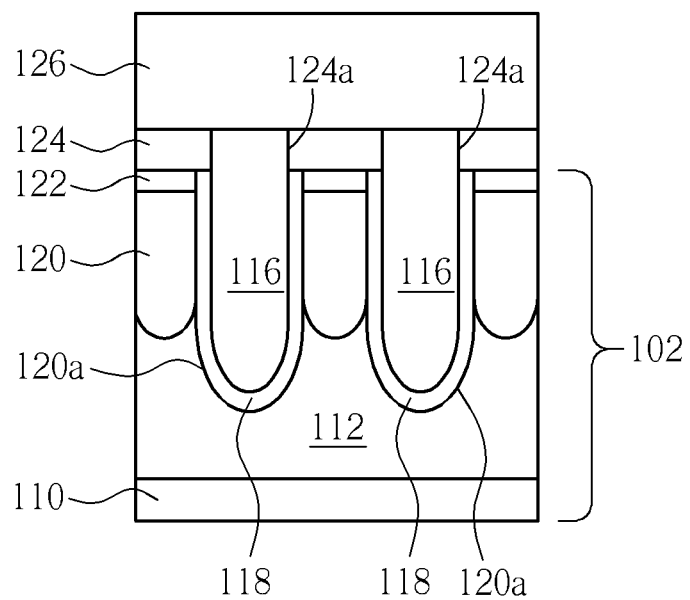
Figure 17:
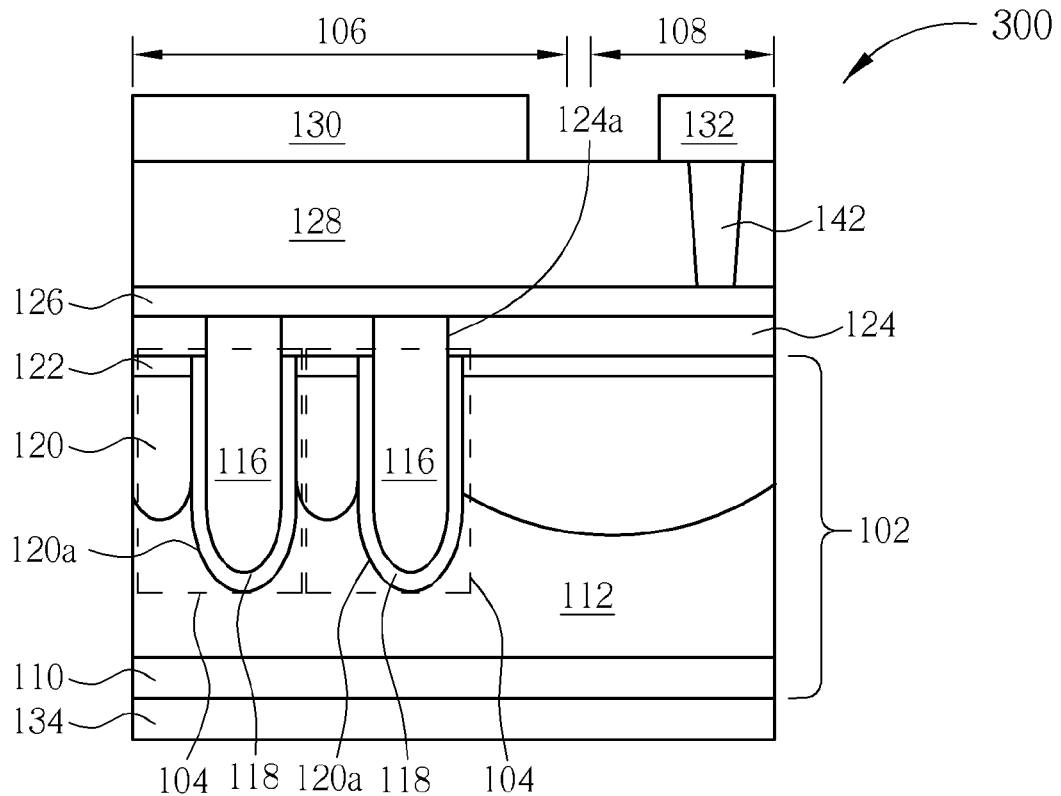
Figure 18:
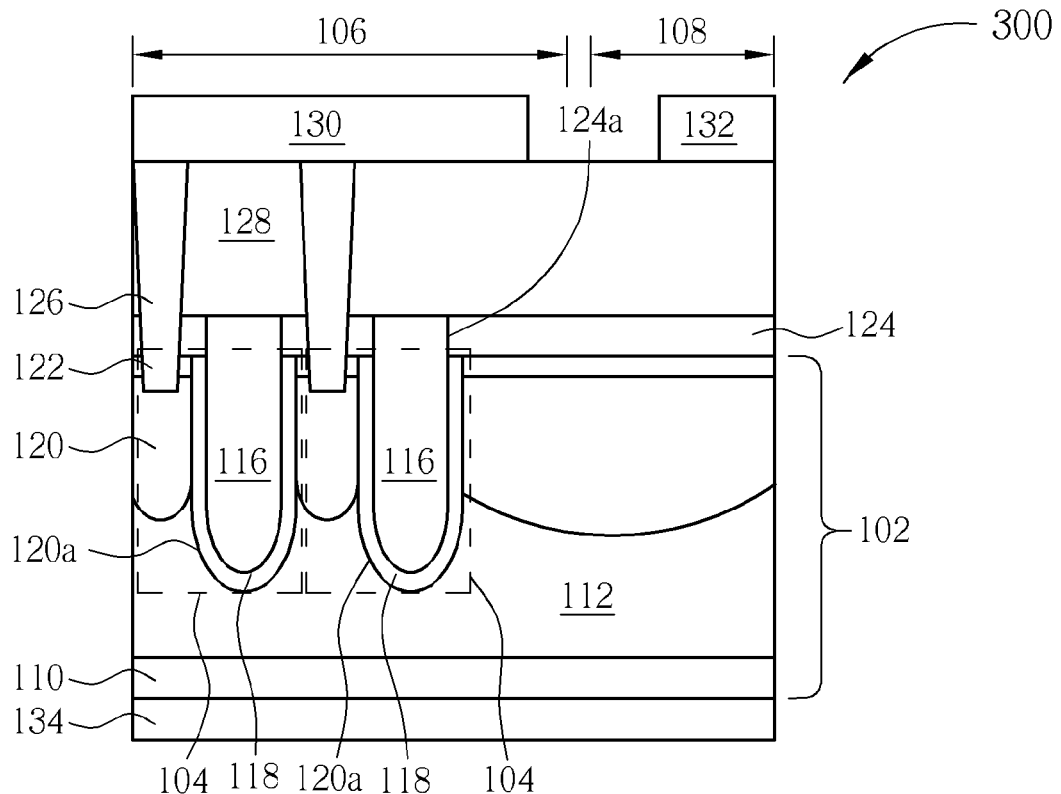

Referring to FIG. 12 through FIG. 18 together with FIG. 1, and FIG. 12 through FIG. 18 are schematic diagrams illustrating a method of fabricating a trench type power transistor device according to a second preferred embodiment of the present invention, wherein FIG. 17 is a schematic diagram illustrating a cross-sectional view of the trench type power transistor device shown in FIG. 1 taken along the line A-A' according to the second preferred embodiment of the present invention, and FIG. 18 is a schematic diagram illustrating a cross-sectional view of the trench type power transistor device shown in FIG. 1 taken along the line B-B' according to the second preferred embodiment of the present invention. As shown in FIG. 12, after providing the N-type semiconductor substrate 102, a mask 302, such as photoresist layer, is formed on the N-type semiconductor substrate 102. Then, the mask 302 is patterned to have a plurality of openings 302a exposing the N-type semiconductor substrate 102, and the exposed N-type semiconductor substrate 102 is removed to form the first trenches 102a and the third trench 102b. Next, the gate insulating layer 118 is formed on the N-type semiconductor substrate 102 in the first trenches 102a. After that, the first gate conductive layer 116 is formed on the mask 302 and is filled into the first trenches 102a, the third trench 102b and the openings 302a, and an etching back process is performed to remove the first gate conductive layer 116 until a top surface of the first gate conductive layer 116 is located at substantially the same level as a top surface of the mask 302. That is, when the first gate conductive layer 116 outside the openings 302a and the first trenches 102a is removed, the etching back process is stopped.

Figure 13:
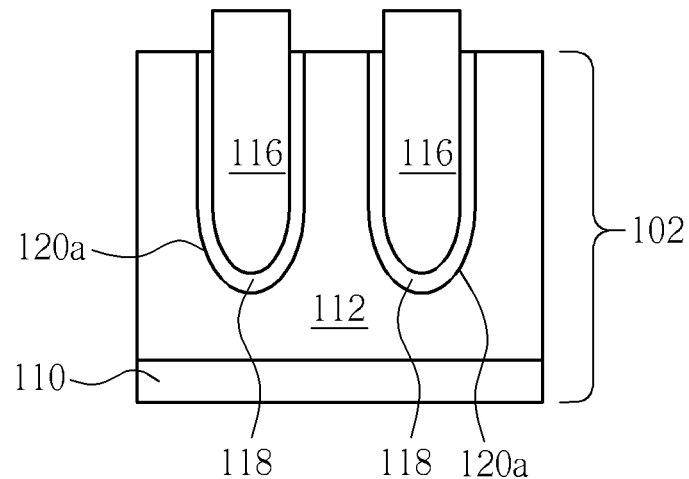
Figure 14:
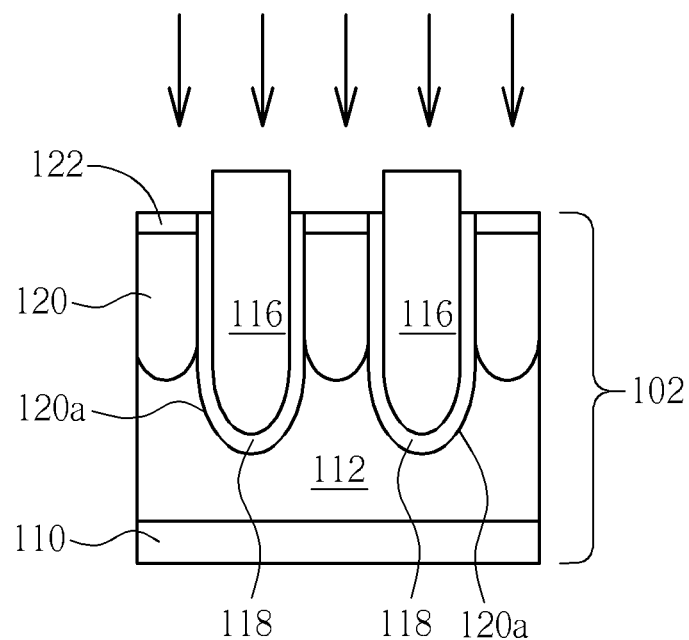

As shown in FIG. 13, the mask 302 is removed subsequently to expose the N-type semiconductor substrate 102, and the first gate conductive layer 116 protrudes out of the first trenches 102a. As shown in FIG. 14, thereafter, the P-type doped body regions 120 are formed in the N-type semiconductor substrate 102, and the N-type doped source regions 122 are formed in the P-type doped body regions 120. As shown in FIG. 15, the first insulating layer 124 is formed on the N-type semiconductor substrate 102 and the first gate conductive layer 116 protruding out of the first trenches 102a, and then, an etching back process is performed to remove the first insulating layer 124 on the first gate conductive layer 116 and expose the first gate conductive layer 116. Since the first gate conductive layer 116 protrudes out of the first trenches 102a, the first gate conductive layer 116 can be used as an etching stop layer in the etching back process. The first insulating layer 124 can have the openings 124a corresponding to the first trenches 102a and the third trench 102b, and the first gate conductive layer 116 protruding out of the first trenches 102a is extended into the openings 124a. In other embodiments of the present invention, the step of removing the first insulating layer 124 on the first gate conductive layer 116 also can use a chemical mechanical polishing (CMP) process.

As shown in FIG. 16, the second gate conductive layer 126 is then formed on the first insulating layer 124 and the first gate conductive layer 116, and the second gate conductive layer 126 is patterned to form the gate leads 126a and expose the first insulating layer 124 and the first gate conductive layer 116. As shown in FIG. 17 and FIG. 18, the second insulating layer 128 is formed on the second gate conductive layer 126, the exposed first insulating layer 124 and the exposed first gate conductive layer 116. Then, the first contact plugs 138 is formed in the second insulating layer 128, the first insulating layer 124 and the N-type doped source regions 122 to be in contact with the N-type source region 122, and simultaneously, the second contact plug 140 is formed in the second insulating layer 128 and the first insulating layer 124 to be in contact with the first gate conductive layer 116. Furthermore, the third contact plug 142 is formed in the second insulating layer 128 to be in contact with the second gate conductive layer 126. Next, the source metal layer 130 is formed on the second insulating layer 128 in the active region 106, and the gate metal layer 132 is formed on the second insulating layer 128 in the peripheral region 108. The source metal layer 130 is in contact with the first contact plugs 138, and the gate metal layer 132 is in contact with the second contact plug 140 and the third contact plug 142. Furthermore, the drain metal layer 134 is formed under the N-type semiconductor substrate 102, and the trench type power transistor device 300 of this embodiment is finished.

In summary, the present invention disposes the second conductive layer between the source metal layer and the first gate conductive layer to electrically connect the first gate conductive to the gate metal layer for shorten the distance between the first gate conductive layer away from the third trench and the gate metal layer. Accordingly, the resistance of each gate of each transistor cell can be reduced, and the input resistance of the gate of the trench type power transistor device can be also reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A trench type power transistor device, comprising:
    a semiconductor substrate of a first conductivity type, having an active region and a peripheral region, and the semiconductor substrate having at least one first trench;
    at least one transistor cell, disposed in the active region, and the transistor cell comprising:
        a first gate conductive layer, disposed in the first trench;
        a gate insulating layer, disposed in the first trench and between the first gate conductive layer and the semiconductor substrate;
        a doped body region of a second conductivity type, disposed in the semiconductor substrate at a side of the first trench; and
        a doped source region of the first conductivity type, disposed in the doped body region;
    a gate metal layer, disposed on the semiconductor substrate in the peripheral region;
    a source metal layer, disposed on the semiconductor substrate in the active region; and
    a second gate conductive layer, disposed between the first gate conductive layer and the source metal layer, and the second gate conductive layer partially overlapping the first gate conductive layer and the source metal layer in a direction perpendicular to the semiconductor substrate, wherein the second gate conductive layer electrically connects the first gate conductive layer to the gate metal layer, and the second gate conductive layer is electrically insulated from the source metal layer and the semiconductor substrate.

2. The trench type power transistor device according to claim 1, wherein the first trench is stripe-shaped, and the stripe-shaped first trench is disposed along a first direction.

3. The trench type power transistor device according to claim 2, wherein the second gate conductive layer comprises at least one stripe-shaped gate lead extending from the active region into the peripheral region, and the stripe-shaped gate lead is disposed along a second direction different from the first direction.

4. The trench type power transistor device according to claim 2, further comprising at least two second trenches arranged in the first direction and parallel to each other, wherein the at least one first trench comprises two first trenches parallel to each other, and each second trench connects the first trenches.

5. The trench type power transistor device according to claim 4, wherein the transistor cell is defined by the first trenches and the second trenches and is rectangular.

6. The trench type power transistor device according to claim 5, wherein the at least one transistor cell comprises a plurality of transistor cells, and the rectangular transistor cells arranged in a matrix formation.

7. The trench type power transistor device according to claim 1, further comprising a first insulating layer, disposed between the second gate conductive layer and the semiconductor substrate.

8. The trench type power transistor device according to claim 7, wherein the first insulating layer has at least one opening corresponding to the first trench, and the second gate conductive layer is filled into the opening.

9. The trench type power transistor device according to claim 7, wherein the first insulating layer has at least one opening corresponding to the first trench, and the first gate conductive layer is extended into the opening.

10. The trench type power transistor device according to claim 1, further comprising a second insulating layer, disposed between the second gate conductive layer and the source metal layer.

11. The trench type power transistor device according to claim 1, further comprising at least two contact plugs disposed on the transistor respectively at two sides of the second gate conductive layer for electrically connecting the doped source region to the source metal layer.

12. The trench type power transistor device according to claim 1, wherein the second gate conductive layer comprises silicide or polysilicon.

* * * * *